(12) United States Patent
Nishida

(10) Patent No.: US 7,567,735 B2
(45) Date of Patent: Jul. 28, 2009

(54) OPTICAL DEVICE WAFER, AND OPTICAL DEVICE CHIP AND METHOD FOR MANUFACTURING THE SAME

(75) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/738,763

(22) Filed: Apr. 23, 2007

(65) Prior Publication Data

US 2007/0280586 A1    Dec. 6, 2007

(30) Foreign Application Priority Data

May 23, 2006    (JP)    ............................ 2006-142303

(51) Int. Cl.
  *G02B 6/12*    (2006.01)
  *H01L 21/00*    (2006.01)
  *H01L 21/82*    (2006.01)
(52) U.S. Cl. .......................... 385/14; 438/113; 438/129
(58) Field of Classification Search .................... 385/14
  See application file for complete search history.

(56) References Cited

U.S. PATENT DOCUMENTS

| | | | | |
|---|---|---|---|---|
| 5,357,123 | A * | 10/1994 | Sugawara | ..................... 257/88 |
| 6,185,240 | B1 * | 2/2001 | Jiang et al. | ............. 372/50.124 |
| 6,353,250 | B1 | 3/2002 | Fukano | |
| 6,770,945 | B2 | 8/2004 | Fukano | |
| 6,917,032 | B2 | 7/2005 | Fukano | |
| 7,256,062 | B2 | 8/2007 | Fukano | |
| 2005/0238076 | A1* | 10/2005 | Kuwata et al. | ............. 372/50.1 |
| 2006/0285567 | A1* | 12/2006 | Otoma | ...................... 372/50.1 |
| 2007/0096119 | A1* | 5/2007 | Sato | ............................. 257/81 |
| 2007/0259472 | A1 | 11/2007 | Fukano | |
| 2008/0031295 | A1 | 2/2008 | Tanaka | |

FOREIGN PATENT DOCUMENTS

| | | |
|---|---|---|
| JP | 07-099344 | 4/1995 |
| JP | 11-261098 | 9/1999 |
| JP | 2004-006548 | 1/2004 |
| JP | 2005-303080 | 10/2005 |

OTHER PUBLICATIONS

Machine Translation of Bito JP 07-099344 A, Completed Jul. 18, 2008.*
Machine Translation of Tanaka JP 2005-303080A, Completed Jul. 18, 2008.*

* cited by examiner

*Primary Examiner*—Uyen Chau N Le
*Assistant Examiner*—Rhonda S Peace
(74) *Attorney, Agent, or Firm*—Harness, Dickey & Pierce, P.L.C.

(57) ABSTRACT

An optical device wafer includes: a plurality of chip regions; and at least one connecting section, wherein the chip region includes a first semiconductor layer of a first conductivity type, an optical layer that emits light or receives light formed above the first semiconductor layer, a second semiconductor layer of a second conductivity type formed above the optical layer, a first electrode electrically connected to the first semiconductor layer, and a second electrode electrically connected to the second semiconductor layer, wherein the connecting section short-circuits the first electrodes, the second electrodes, or the first electrode and the second electrode in adjacent ones of the chip regions.

9 Claims, 4 Drawing Sheets

OPTICAL DEVICE WAFER, AND OPTICAL DEVICE CHIP AND METHOD FOR MANUFACTURING THE SAME

The entire disclosure of Japanese Patent Application No. 2006-142303, filed May 23, 2006 is expressly incorporated by reference herein.

BACKGROUND

1. Technical Field

The present invention relates to optical device wafers, optical device chips and methods for manufacturing the same.

2. Related Art

An optical device such as a surface-emitting type semiconductor laser itself has a low electrostatic breakdown voltage, such that the device may be damaged by static electricity caused by a machine or an operator in a mounting process. A variety of measures are usually implemented in a mounting process to remove static electricity, but these measures have limitations.

For example, Japanese laid-open patent application JP-A-2004-6548 describes a technology to compose a capacitance device by laminating insulating films and metal films wherein the capacitance device serves as a breakdown voltage device. In this case, it may take a long time for laminating layers to form a desired capacitance device as the insulating films and metal films are laminated.

SUMMARY

In accordance with an advantage of some aspects of the invention, electrostatic destruction can be prevented and reliability can be improved in optical device wafers, and optical device chips and methods for manufacturing the same.

In accordance with an embodiment of the invention, an optical device wafer includes: a plurality of chip regions; and at least one connecting section, wherein the chip region includes a first semiconductor layer of a first conductivity type, an optical layer that emits light or receives light formed above the first semiconductor layer, a second semiconductor layer of a second conductivity type formed above the optical layer, a first electrode electrically connected to the first semiconductor layer, and a second electrode electrically connected to the second semiconductor layer, and the connecting section short-circuits the first electrodes, the second electrodes or the first electrode and the second electrode in adjacent ones of the chip regions.

In the optical device wafer, the connecting section serves as a refuge for a current. In other words, upon application of a voltage that may cause electrostatic destruction at an optical section (to be described below) in each of the chip regions, a current is circulated and distributed in the connecting section and the electrodes of the other chip regions. By this, electrostatic destruction of the optical section can be prevented in an optical device chip manufacturing process, such that, by the optical device wafer described above, the reliability can be improved.

It is noted that, in descriptions concerning the invention, the term "above" may be used, for example, in a manner as "a specific member (hereafter referred to as 'B') formed 'above' another specific member (hereafter referred to as 'A')." In descriptions concerning the invention, the term "above" is used, in such an exemplary case described above, assuming that the use of the term includes a case of "B" formed directly on "A," and a case of "B" formed over "A"through another member on "A."

The optical device wafer in accordance with an aspect of the embodiment may include a non-chip region that is a region other than the chip region, and the non-chip region may include a non-chip region connecting section that short-circuits the first electrode and the second electrode in at least one of the chip regions.

In the optical device wafer in accordance with an aspect of the embodiment, the connecting section may include plural connecting sections, and the plural connecting sections may include a first connecting section that short-circuits the first electrodes in adjacent ones of the chip regions, a second connecting section that short-circuits the second electrodes in adjacent ones of the chip regions, and a third connecting section that short-circuits the first electrode and the second electrode in adjacent ones of the chip regions.

The optical device wafer in accordance with an aspect of the embodiment may be a surface-emitting type semiconductor laser wafer, wherein the first semiconductor layer and the second semiconductor layer may be distributed Bragg reflection type mirrors, and the optical layer may be an active layer.

The optical device wafer in accordance with an aspect of the embodiment may be a photodiode wafer, wherein the optical layer may be a light absorbing layer.

It is noted that, in the invention, the "light absorbing layer" conceptually includes a depletion layer.

An optical device chip in accordance with an embodiment of the invention includes: a first semiconductor layer of a first conductivity type; an optical layer that emits light or receives light formed above the first semiconductor layer; a second semiconductor layer of a second conductivity type formed above the optical layer; a first electrode electrically connected to the first semiconductor layer; a second electrode electrically connected to the second semiconductor layer; and at least one conductive section that protrudes from at least one of the first electrode and the second electrode and extends to an end section of the optical device chip.

In the optical device chip in accordance with an aspect of the embodiment of the invention, the conductive section may include a first conductive section protruding from a pad section of the first electrode and extending to the end section of the optical device chip; and a second conductive section protruding from a pad section of the second electrode and extending to the end section of the optical device chip.

In the optical device chip in accordance with an aspect of the embodiment of the invention, the optical device chip may have a rectangular plane configuration, the first conductive section may include a first direction first conductive section formed along a first direction in parallel with one side of the rectangular plane configuration and a second direction first conductive section formed along a second direction orthogonal to the first direction, and the second conductive section may include a first direction second conductive section formed along the first direction and a second direction second conductive section formed along the second direction.

A method for manufacturing an optical device chip in accordance with an embodiment of the invention includes the steps of: forming a plurality of chip regions, which includes the steps of forming a first conductive layer of a first conductivity type above a substrate, forming an optical layer that emits light or receives light above the first semiconductor layer, forming a second semiconductor layer of a second conductivity type above the optical layer, forming a first electrode that is electrically connected to the first semiconductor layer, and forming a second electrode that is electrically connected to the second semiconductor layer; forming at least one connecting section that short-circuits the first electrodes, the second electrodes, or the first electrode and the second electrode in adjacent ones of the chip regions, thereby forming an optical device wafer; and dicing the optical device wafer to cut the connecting section.

DESCRIPTION OF EXEMPLARY EMBODIMENTS

Preferred embodiments of the invention are described below with reference to the accompanying drawings.

1. First, an optical device wafer 400 in accordance with an embodiment of the invention is described.

Figure 1:
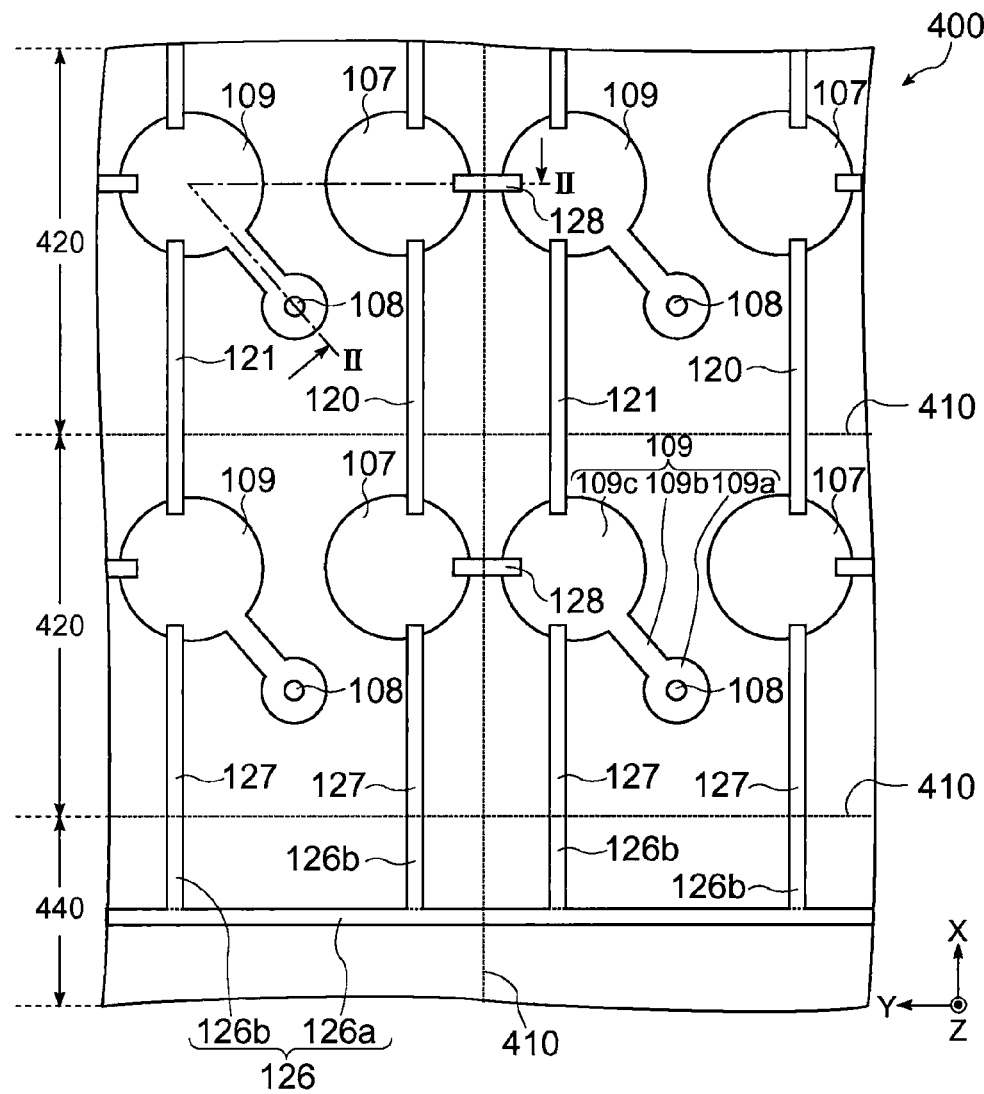
FIG. 1 is a schematic plan view of an optical device wafer in accordance with an embodiment of the invention.
Figure 2:
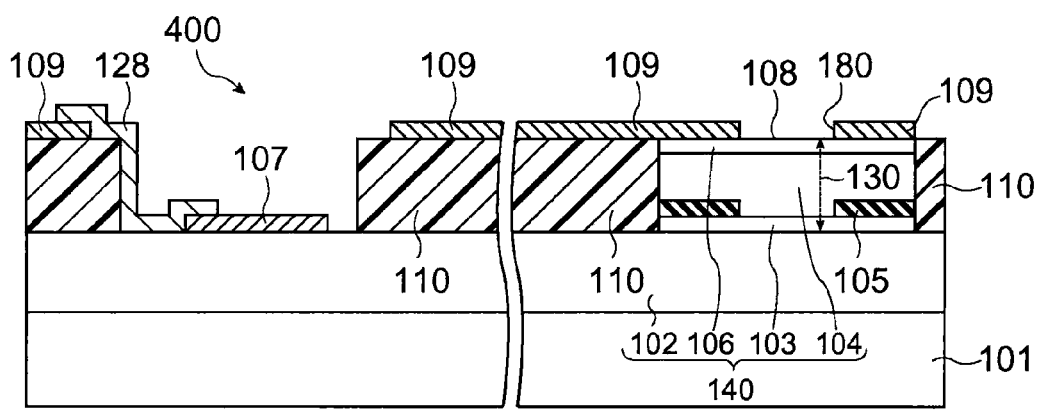
FIG. 2 is a schematic cross-sectional view of the optical device wafer in accordance with the embodiment.

FIG. 1 schematically shows a plan view of the optical device wafer 400 in accordance with the present embodiment, and FIG. 2 is a cross-sectional view taken along lines II-II of FIG. 1. In the present embodiment, an example in which the optical device wafer 400 is a surface-emitting type semiconductor laser wafer is described.

Figure 4:
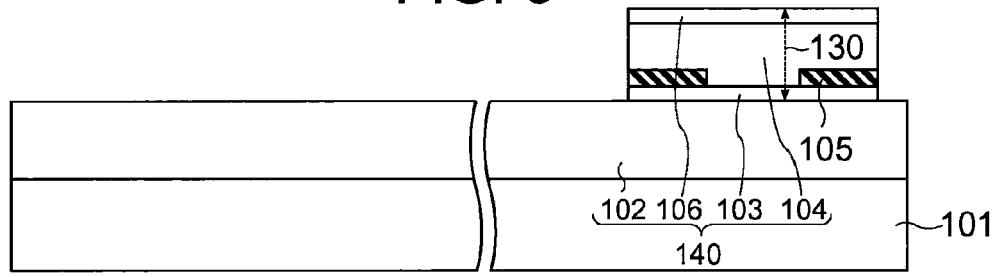
FIG. 4 is a schematic cross-sectional view showing a manufacturing step of manufacturing the optical device chip in accordance with the embodiment.

The optical device wafer 400 may include a plurality of chip regions 420, connecting sections 120, 121 and 128, and a region 440 (non-chip region) other than the chip regions 420. It is noted that FIG. 4 shows four chip regions 420 for the sake of convenience, but the number of the chip regions 420 is not particularly limited.

Each of the chip regions 420 may include a substrate 101, an optical section (a light emitting section) 140, a dielectric layer 110, a first electrode 107, and a second electrode 109. The chip region 420 has a plane configuration that is in, for example, a rectangular shape shown in FIG. 1.

As the substrate 101, for example, a GaAs substrate of a first conductivity type (for example, n-type) may be used. The optical section 140 is formed on the substrate 101. The optical section 140 may include a first semiconductor layer 102 of the first conductivity type (n-type), an optical layer 103 that is formed on the first semiconductor layer 102 and emits light, a second semiconductor layer 104 of a second conductivity type (for example, p-type) that is formed on the optical layer 103, and a contact layer 106 that is formed on the second semiconductor layer 104. More concretely, the first semiconductor layer 102 is, for example, a distributed Bragg reflection type (DBR) mirror of 40 pairs of alternately laminated n-type $Al_{0.9}Ga_{0.1}As$ layers and n-type $Al_{0.15}Ga_{0.85}As$ layers.

The optical layer 103 is an active layer that has a multiple quantum well (MQW) structure in which quantum well structures each formed from, for example, a GaAs well layer and an $Al_{0.3}Ga_{0.7}As$ barrier layer are laminated in three layers. The second semiconductor layer 104 is, for example, a DBR mirror of 25 pairs of alternately laminated p-type $Al_{0.9}Ga_{0.1}As$ layers and p-type $Al_{0.15}Ga_{0.85}As$ layers. The first semiconductor layer 102, the optical layer 103 and the second semiconductor layer 104 can form a resonator. It is noted that the composition of each of the layers and the number of the layers composing the first semiconductor layer 102, the optical layer 103 and the second semiconductor layer 104 are not particularly limited. The p-type second semiconductor layer 104, the optical layer 103 that is not doped with an impurity and the n-type first semiconductor layer 102 form a pin diode.

The contact layer 106 is, for example, a GaAs layer of the second conductivity type (p-type). For example, the contact layer 106, the second semiconductor layer 104 and the optical layer 103 can form a columnar semiconductor laminate (hereafter referred to as a "columnar section") 130. The columnar section 130 has a plane configuration that is, for example, in a circular shape.

Also, as shown in FIG. 2, for example, at least one of the layers composing the second semiconductor layer 104 can be formed as an oxidized constricting layer 105. The oxidized constricting layer 105 is formed in a region near the optical layer 103. As the oxidized constricting layer 105, for example, an oxidized AlGaAs layer can be used. The oxidized constricting layer 105 is a dielectric layer having an opening section. The oxidized constricting layer 105 is formed in a ring shape.

The first electrode 107 is formed on a top surface of the first semiconductor layer 102. The first electrode 107 is electrically connected to the first semiconductor layer 102. The first electrode 107 serves as an electrode pad that is connected to an external wiring or the like. The first electrode 107 has a plane configuration that is, for example, a circular shape shown in FIG. 1.

The second electrode 109 is formed on the contact layer 106 and the dielectric layer 110. The second electrode 109 is electrically connected to the second semiconductor layer 104 through the contact layer 106. The second electrode 109 may include, as shown in FIG. 1, a contact section 109a, a lead-out section 109b and a pad section 109c. The second electrode 109 is in contact with the contact layer 106 at the contact section 109a. The contact section 109a of the second electrode 109 has a plane configuration that is, for example, in a ring shape shown in FIG. 1. The contact section 109a has an opening section 180 over the columnar section 130. The opening section 180 defines a region where the contact section 109a is not provided on the upper surface of the contact layer 106. This region defines an emission surface 108 for emission of laser light. The emission surface 108 has a configuration that is, for example, in a circular shape shown in FIG. 1. The lead-out section 109b of the second electrode 109 connects the contact section 109a and the pad section 109c. The lead-out section 109b has, for example, a linear plane configuration shown in FIG. 1. The pad section 109c of the second electrode 109 serves as an electrode pad to be connected to an external wiring or the like. The pad section 109c has a plane configuration that is, for example, a circular shape shown in FIG. 1.

The dielectric layer 110 is formed on the first semiconductor layer 102. The dielectric layer 110 is formed in a manner to surround the columnar section 130. The lead-out section 109b and the pad section 109c of the second electrode 109 are formed on the dielectric layer 110. The dielectric layer 110 electrically isolates the second electrode 109 from the first semiconductor layer 102.

The connecting section 120 may short-circuit, for example, the first electrodes 107 of adjacent ones of the chip regions 420 to each other. The connecting section 121 may short-circuit, for example, the second electrodes 109 of adjacent ones of the chip regions 420 to each other. The connecting section 128 may short-circuit, for example, the first electrode 107 and the second electrode 109 of adjacent ones of the chip regions 420 to each other. In the illustrated example, the plural connecting sections may include the first connecting section 120 that short-circuits the first electrodes 107 of adjacent ones of the chip regions 420 to each other, the second connecting section 121 that short-circuits the second electrodes 109 of adjacent ones of the chip regions 420 to each other, and the third connecting section 128 that short-circuits the first electrode 107 and the second electrode 109 of adjacent ones of the chip regions 420 to each other.

The first connecting section 120 is formed, for example, along a first direction (X-direction) that is in parallel with a side of the chip region 420, as shown in FIG. 1. The first connecting section 120 mutually connects the first electrodes 107 of adjacent ones of the chip regions 420 that are arranged along, for example, the X-direction. The first connecting section 120 protrudes, for example, in the X-direction from the marginal portion of the first electrode 107 of the chip region 420, and extends to the marginal portion of the first electrode 107 of the adjacent other chip region 420 arranged in the X-direction. The first connecting section 120 is formed on the first semiconductor layer 102. The first connecting section 120 may be formed, for example, extending over the first electrode 107. For example, both end sections of the first connecting section 120 may be formed, for example, on the first electrodes 107.

The second connecting section 121 is formed, for example, along the X-direction, as shown in FIG. 1. The second connecting section 121 mutually connects the second electrodes 109 of adjacent ones of the chip regions 420 that are arranged along, for example, the X-direction. The second connecting section 121 protrudes, for example, in the X-direction from the marginal portion of the pad section 109c of the second electrode 109 of the chip region 420, and extends to the marginal portion of the pad section 109c of the second electrode 109 of the adjacent other chip region 420 arranged in the X-direction. The second connecting section 121 is formed on the dielectric layer 110. The second connecting section 121 may be formed, for example, extending over the second electrode 109. For example, both end sections of the second connecting section 121 may be formed, for example, on the second electrodes 109.

The third connecting section 128 is formed, for example, along a Y-direction, as shown in FIG. 1. The third connecting section 128 mutually connects the first electrode 107 and the pad section 109c of the second electrode 109 of adjacent ones of the chip regions 420 that are arranged along, for example, the Y-direction. The third connecting section 128 protrudes, for example, in the Y-direction from the marginal portion of the first electrode 107 of the chip region 420, and extends to the marginal portion of the pad section 109c of the second electrode 109 of the adjacent other chip region 420 arranged in the Y-direction. The third connecting section 128 is formed on the dielectric layer 110 and the first semiconductor layer 102, as shown in FIG. 2. The third connecting section 128 may be formed, for example, extending over the first electrode 107 and the second electrode 109. For example, one end section of the third connecting section 128 may be formed, for example, on the first electrode 107, and the other end section thereof may be formed, for example, on the second electrode 109. The third connecting section 128 may be formed in the shortest route between the pad section of the first electrode 107 and the pad section 109c of the second electrode 109 as viewed in a plan view, for example, as shown in FIG. 1. By this, the first electrode 107 and the second electrode 109 in adjacent ones of the chip regions can be short-circuited by the third connecting section 128 with a necessity minimum distance. Similarly, as viewed in a plan view, the first connecting section 120 described above can be formed in the shortest route between the first electrodes 107 of adjacent ones of the chip regions. Also, the second connecting section 121 described above can be formed in the shortest route between the second electrodes 109 of adjacent ones of the chip regions.

The connecting section may be in a singular or a plurality, and plural connecting sections are provided in the illustrated example. Each of the connecting sections 120, 121 and 128 has a plane configuration that may be composed of a single linear line, for example, as shown in FIG. 1, but may be composed of a plurality of linear lines. The plane configuration of each of the connecting sections may be, for example, a single curved line or a plurality of curved lines without any particular limitation. The composing material, position, length, width and thickness of each of the connecting sections may be appropriately selected. The connecting sections may be composed of, for example, a material different from that of the first electrode 107 and the second electrode 109. More concretely, when the first electrode 107 and the second electrode 109 are composed of, for example, gold (Au), the connecting section 120 may be composed of aluminum (Al). It is noted that the connecting section 120 may be composed of, for example, the same material as that of at least one of the first electrode 107 and the second electrode 109.

The non-chip region 440 includes a non-chip region connecting section 126 that short-circuits the first electrode 107 and the second electrode 109 within at least one of the chip regions 420. For example, the non-chip region connecting section 126 short-circuits at least one set of the first electrode 107 and the second electrode 109 among the first electrodes 107 and the second electrodes 109 in each of the chip regions 420. The non-chip region connecting section 126 has a plane configuration that is, for example, in a comb shape, as shown in FIG. 1. The non-chip region connecting section 126 includes, for example, a main axis section 126a that extends in the second direction (Y-direction), and a branching section 126b that branches from the main axis section 126a and extends in the first direction (X-direction). The main axis section 126a and the branching section 126b each have a plane configuration that is, for example, in a linear shape, as shown in FIG. 1. FIG. 1 shows four branching sections 126b for the sake of convenience, but the number of the branching sections 126b is not particularly limited.

Lead-out conductive sections 127 that connect the first electrodes 107 to the non-chip region connecting section 126 are formed in the chip region 420 adjacent to the non-chip region 440, for example, as shown in FIG. 1. Further, lead-out conductive sections 127 that connect, for example, the second electrodes 109 to the non-chip region connecting section 126 are formed in the chip region 420 adjacent to the non-chip region 440. For example, the lead-out conductive sections 127 may be formed continuously in one piece with the branching sections 126b of the non-chip region connecting section 126. The lead-out conductive section 127 has a plane configuration that may be, for example, in a linear shape shown in FIG. 1.

As the non-chip region connecting section 126 is connected to the lead-out conductive sections 127, the first electrode 107 and the second electrode 109 in each of the chip regions 420 can be short-circuited to one another. In the illustrated example, the non-chip region connecting section 126 short-circuits the first electrode 107 and the second electrode 109 in each of the entire chip regions 420 through the connecting sections 120, 121 and 128 that connect the electrodes 107 and 109.

2. Next, an example of a method for manufacturing an optical device wafer 400 in accordance with an embodiment of the invention, and an example of a method for manufacturing an optical device chip in accordance with an embodiment of the invention and an example of an optical device chip 100 obtained by the manufacturing method are described with reference to the accompanying drawings.

Figure 3:
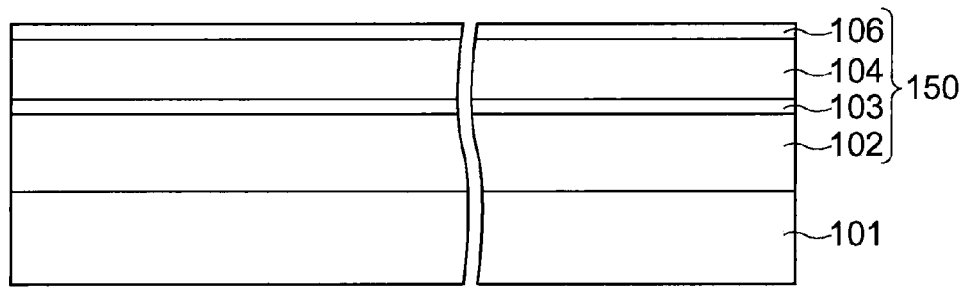
FIG. 3 is a schematic cross-sectional view showing a manufacturing step of manufacturing an optical device wafer in accordance with an embodiment of the invention.
Figure 5:
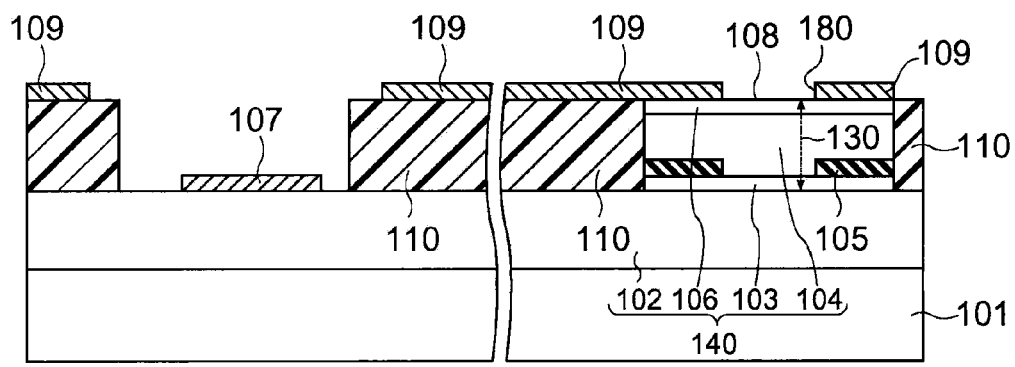
FIG. 5 is a schematic cross-sectional view showing a manufacturing step of manufacturing the optical device chip in accordance with the embodiment.
Figure 6:
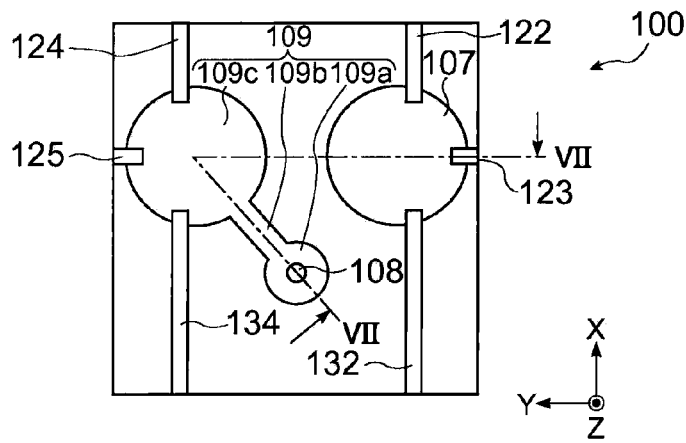
FIG. 6 is a schematic plan view showing an optical device chip in accordance with an embodiment of the invention.
Figure 7:
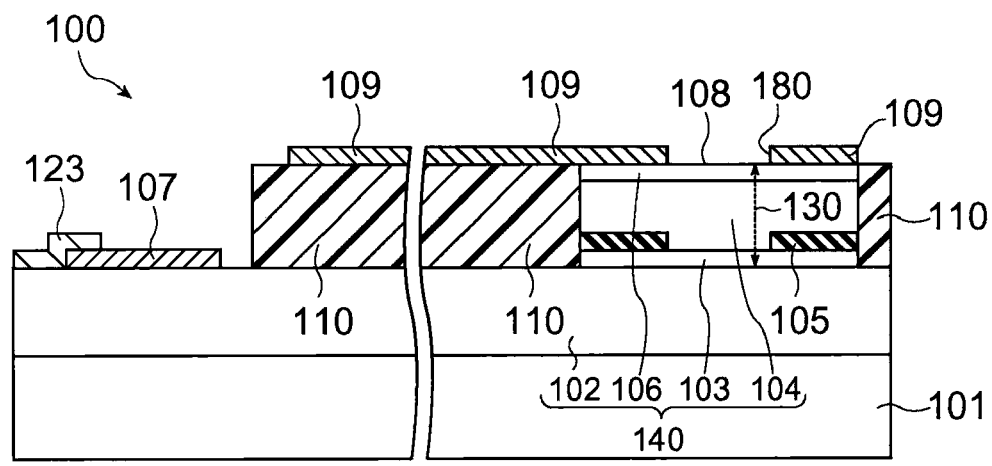
FIG. 7 is a schematic cross-sectional view of the optical device chip in accordance with the embodiment.

FIG. 3 through FIG. 5 are cross-sectional views schematically showing a process for manufacturing the optical device wafer 400 in accordance with the present embodiment shown in FIG. 1 and FIG. 2, and correspond to the cross-sectional view shown in FIG. 2, respectively. Also, FIG. 6 is a plan view schematically showing the optical device chip 100 obtained by the method of manufacturing an optical device chip in accordance with the present embodiment, and FIG. 7 is a cross-sectional view taken along lines VII-VII in FIG. 6. In the present embodiment, examples in which the optical device wafer 400 is a surface-emitting type semiconductor laser wafer, and the optical device chip 100 is a surface-emitting type semiconductor laser chip are described.

(1) First, as shown in FIG. 3, for example, an n-type GaAs substrate is prepared as a substrate 101. Next, a semiconductor multilayer film 150 is formed on the substrate 101 by epitaxial growth while modifying its composition. The semiconductor multilayer film 150 is composed of successively laminated semiconductor layers that compose a first semiconductor layer 102, an optical layer 103, a second semiconductor layer 104, and a contact layer 106. It is noted that, when the second semiconductor layer 104 is grown, at least one layer thereof near the optical layer 103 may be formed to be a layer that is later oxidized and becomes an oxidized constricting layer 105. As the layer that becomes to be the oxidized constricting layer 105, for example, an AlGaAs layer with its Al composition being 0.95 or greater can be used.

(2) Next, as shown in FIG. 4, the semiconductor multilayer film 150 is patterned to form the first semiconductor layer 102, the optical layer 103, the second semiconductor layer 104 and the contact layer 106 in a desired configuration. As a result, a columnar section 130 is formed. The semiconductor multilayer film 150 can be patterned by, for example, lithography technique and etching technique.

Then, by placing the substrate 101 on which the columnar section 130 is formed through the aforementioned steps in a water vapor atmosphere at about 400° C., for example, the layer that becomes to be an oxidized constricting layer 105 is oxidized from its side surface, thereby forming the oxidized constricting layer 105.

(3) Next, as shown in FIG. 5, a dielectric layer 110 is formed on the first semiconductor layer 102 in a manner to surround the columnar section 130. First, a dielectric layer composed of polyimide resin is formed over the entire surface by using, for example, a spin coat method. Then, the top surface of the columnar section 130 is exposed by, for example, a CMP method. Then, the dielectric layer is patterned by, for example, lithography technique and etching technique. In this manner, the dielectric layer 110 in a desired configuration can be formed.

Then, first and second electrodes 107 and 109 are formed. These electrodes can be formed in a desired configuration by, for example, a vacuum vapor deposition method and a lift-off method combined. It is noted that the order to form the electrodes is not particularly limited.

(4) By the steps described above, chip regions 420 in accordance with the present embodiment are formed, as shown in FIG. 1 and FIG. 2.

(5) Then, connecting sections 120, 121 and 128 are formed in a manner to short-circuit the first electrodes 107, the second electrodes 109 and the first electrode 107 and the second electrode 109 in adjacent ones of the chip regions 420, respectively, as shown in FIG. 1 and FIG. 2. The connecting sections 120, 121 and 128 may be formed in desired configurations, respectively, by, for example, a vacuum vapor deposition method and a lift-off method combined or the like. It is noted that, if the connecting sections 120, 121 and 128 are formed with the same material as that of at least one of the first electrode 107 and the second electrode 109, they can be formed by the same manufacturing process.

(6) By the steps described above, the optical device wafer 400 in accordance with the present embodiment is obtained, as shown in FIG. 1 and FIG. 2.

(7) Then, the optical device wafer 400 is cut and divided (diced) along scribe lines 410, whereby the connecting sections 120, 121 and 128 provided on the optical device wafer 400 are cut.

(8) By the steps described above, the optical device chip 100 in accordance with the present embodiment is obtained, as shown in FIG. 6 and FIG. 7. FIG. 6 is a plan view schematically showing the optical device chip 100, and FIG. 7 is a cross-sectional view taken along lines VII-VII of FIG. 6.

The optical device chip 100 may include the substrate 101, the optical section (light emission section) 140, the dielectric layer 110, the first electrode 107, the second electrode 109, and conductive sections 122, 132, 123, 124, 134 and 125 that protrude from at least one of the pad sections of the first electrode 107 and the second electrode 109 and extend to the edge of the optical device chip 100. The optical device chip 100 has a plane configuration that is, for example, in a rectangular shape as shown in FIG. 1.

The conductive section may be in a singular or a plurality, and plural conductive sections are provided in the illustrated example. In the illustrated example, the conductive section may include first conductive sections 122, 132 and 123 that protrude from the marginal section of the pad section of the first electrode 107, and extend to the end of the optical device chip 100. The first conductive section may include first direction first conductive sections 122 and 132 that are formed along a first direction (X-direction) in parallel with a side of the optical device chip 100, and a second direction first conductive section 123 that is formed along a second direction (Y-direction) orthogonal to the first direction. The first direction first conductive section may include a first normal direction first conductive section 122 formed along one of directions (a normal direction in the X-direction) of the first direction, and a first reverse direction first conductive section 132 formed along the other direction (a reverse direction in the X-direction) of the first direction. The first normal direction first conductive section 122 and the first reverse direction first conductive section 132 protrude in mutually opposite directions from the marginal section of the pad section of the first electrode 107. The first direction first conductive sections 122 and 132 are obtained through cutting the first connecting section 120 of the optical device wafer 400 described above, and the second direction first conductive section 123 is obtained through cutting the third connecting section 128 of the optical device wafer 400.

Also, in the illustrated example, the conductive section may include second conductive sections 124, 134 and 125 that protrude from the marginal section of the pad section 109c of the second electrode 109, and extend to the end of the optical device chip 100. The second conductive section may include first direction second conductive sections 124 and 134 that are formed along the first direction, and a second direction second conductive section 125 that is formed along the second direction. The first direction second conductive section may include a first normal direction second conductive section 124 formed along one of directions (the normal direction in the X-direction) of the first direction, and a first reverse direction second conductive section 134 formed along the other direction (the reverse direction in the X-direction) of the first direction. The first normal direction second conductive section 124 and the first reverse direction second conductive section 134 protrude in mutually opposite directions from the marginal section of the pad section 109c of the second electrode 109. The first direction second conductive sections 124 and 134 are obtained through cutting the second connecting section 121 of the optical device wafer 400 described above, and the second direction second conductive section 125 is obtained through cutting the third connecting section 128 of the optical device wafer 400.

The second direction first conductive section 123 may be formed in the shortest route between the pad section of the first electrode 107 and the end section of the optical device chip 100, for example, as shown in FIG. 6. Similarly, the second direction second conductive section 125 may be formed in the shortest route between the pad section 109c of the second electrode 109 and the end section of the optical device chip 100, for example, as shown in FIG. 6. The second direction first conductive section 123 and the second direction second conductive section 125 protrude in mutually opposite directions from the marginal sections of the pad sections of the electrodes 107 and 109, respectively. It is noted that the first normal direction first conductive section 122 and the first reverse direction first conductive section 132 described above may be formed in the shortest route between the pad section of the first electrode 107 and the end section of the optical device chip 100. Also, the first normal direction second conductive section 124 and the first reverse direction second conductive section 134 described above may be formed in the shortest route between the pad section 109c of the second electrode 109 and the end section of the optical device chip 100.

3. Next, modified examples of the embodiment are described. It is noted that features different from those of the embodiment example described above are described, and description of the same features shall be omitted.

The example of the optical device wafer 400 shown in FIG. 1 and FIG. 2 is described as to the case where the optical device wafer 400 is a surface-emitting type semiconductor laser wafer (hereafter called the "example of the optical device wafer 400"). However, the invention is also applicable to other light emitting device wafers (such as, for example, LED wafers, organic LED wafers, and edge-emitting type semiconductor laser wafers).

Also, the invention is applicable to photodetector device wafers (such as, for example, pin type photodiode (PD) wafers, pn type PD wafers, avalanche type PD wafers, and MSM type PD wafers). For example, FIG. 8 is a cross-sectional view schematically showing an example in which an optical device wafer 200 is a pin type PD wafer.

Figure 8:
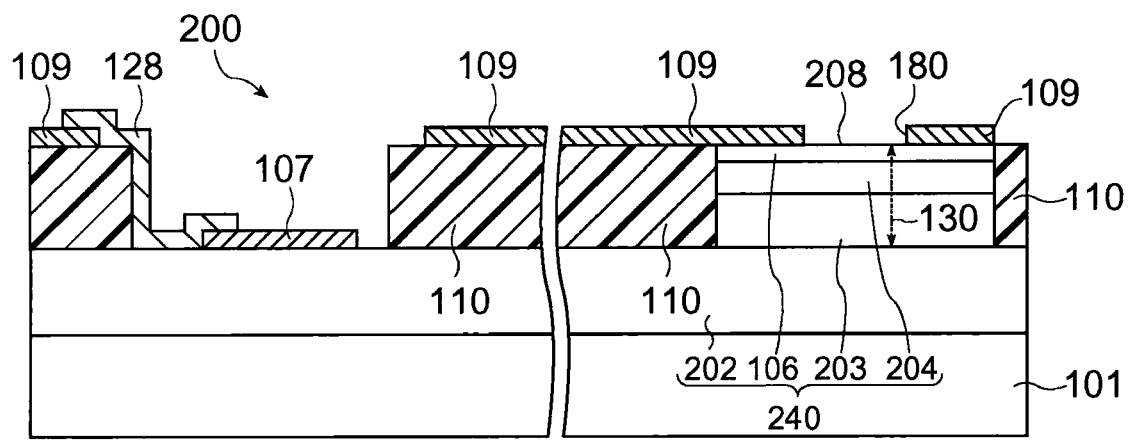
FIG. 8 is a schematic cross-sectional view of an optical device chip in accordance with a modified example of the present embodiment.

The optical device wafer 200 can have an optical section (light receiving section) 240, instead of the optical section 140 of the example of the optical device wafer 400, as shown in FIG. 8. The optical section 240 may include a first conductive layer 202 of a first conductivity type (for example, n-type), an optical layer 203 formed on the first semiconductor layer 202, a second semiconductor layer 204 of a second conductivity type (for example, p-type) formed on the optical layer 203, and a contact layer 106 formed on the second semiconductor layer 204. Concretely, the first semiconductor layer 202 is composed of, for example, an n-type GaAs layer. The optical layer 203 is a photoabsorption layer composed of a GaAs layer in which no impurity is doped. The second semiconductor layer 204 is composed of, for example, a p-type GaAs layer. The first semiconductor layer 202, the optical layer 203 and the second semiconductor layer 204 can function as a pin type PD. In the optical device wafer 200, a light incidence surface 208 is formed, instead of the light emission surface 108 of the example of the optical device wafer 400.

Also, the invention is applicable to, for example, an optical device wafer in which the optical section (light emitting section) 140 and the optical section (light receiving section) 240 are laminated (for example, a surface-emitting type semiconductor laser wafer with a monitor PD).

Figure 9:
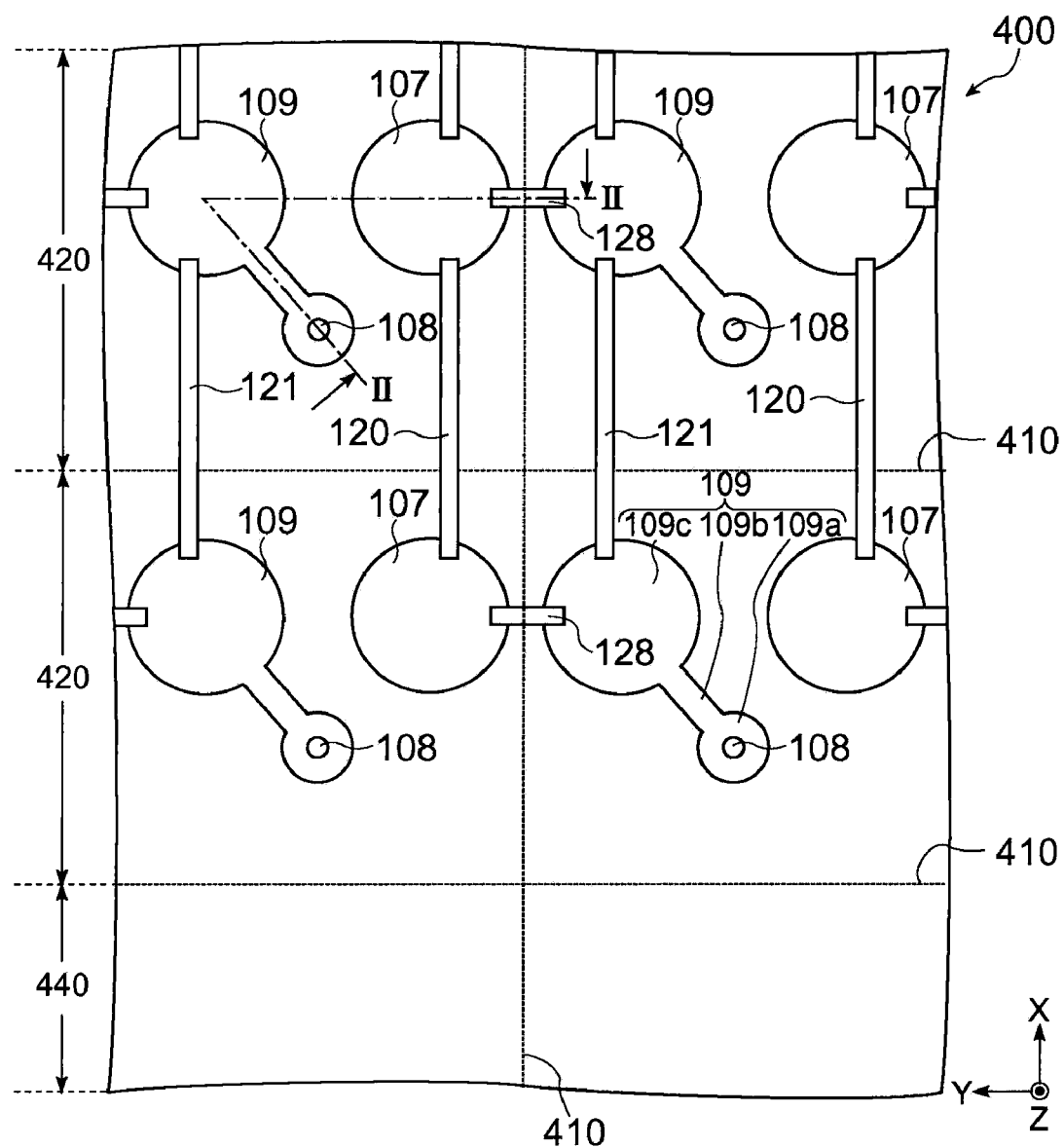
FIG. 9 is a schematic cross-sectional view of an optical device wafer in accordance with a modified example of the present embodiment.

Also, the example of the optical device wafer 400 is described as to a case in which the first electrode 107 and the second electrode 109 in each of the chip regions 420 are short-circuited. However, in accordance with a modified example, the first electrode 107 and the second electrode 109 in each of the chip regions 420 may not be short-circuited. In this modified example, a non-chip region connecting section 126 may not be provided in a non-chip region 440, and lead-out connecting sections 127 may not be provided, for example, as shown in FIG. 9. It is noted that FIG. 9 is a plan view schematically showing an optical device wafer 400 in accordance with the modified example.

Also, an optical device chip that is obtained through dicing the optical device wafer in accordance with the modified example described above is a modified example of the optical device chip in accordance with the embodiment of the invention.

It is noted that the modified examples described above are only examples, and the invention is not limited to the modified examples.

5. In the optical device wafer 400 in accordance with the present embodiment, even when a voltage that would cause electrostatic destruction of the optical section 140 is applied, the current can be prevented from flowing to the optical section 140, because the electrodes 107 and 109 connected to the optical section 140 are short-circuited, as shown in FIG. 1. In other words, the current flows through, for example, the connecting sections 120, 121 and 128, the lead-out conductive section 127, and the non-chip region connecting section 126. By this, electrostatic destruction of the optical section 140 can be prevented during the process for manufacturing an optical device chip, such that, in accordance with the present embodiment, the reliability of the optical device wafer 400 and the optical device chip 100 can be improved.

Also, in accordance with the present embodiment, the connecting sections 120, 121 and 128 are cut before the optical device chip 100 is completed. By this, the optical section 140 in the completed optical device chip 100 can be normally operated.

Also, when the first electrode 107 and the second electrode 109 in each of the chip regions 420 are not short-circuited, like the optical device wafer 400 in accordance with the modified example shown in FIG. 9, the connecting sections 120, 121 and 128 can serve as refuges for current. More specifically, upon application of a voltage that may cause electrostatic destruction at the optical section 140 in each of the chip regions 420, the resultant current is circulated and distributed in the connecting sections 120, 121 and 128 and the electrodes 107 and 109 of the other chip regions 420. By this, electrostatic destruction of the optical section 140 can be prevented in an optical device chip manufacturing process.

Also, similarly, the conductive sections 122, 132, 123, 124, 134 and 125 in the optical device chip 100 in accordance with the present embodiment can serve as refuges for current. More specifically, upon application of a voltage that may cause electrostatic destruction at the optical section 140 in the optical device chip 100, the resultant current is circulated and distributed in the conductive sections 122, 132, 123, 124, 134 and 125. By this, electrostatic breakdown of the optical section 140 can be prevented in an optical device chip mounting process.

Also, in the method for manufacturing the optical device chip 100 in accordance with the present embodiment, for example, the connecting sections 120, 121 and 128 can be formed with a material different from that of the first electrode 107 and the second electrode 109. By this, for example, the connecting sections 120, 121 and 128 can be formed from a material that can be more readily cut in the step of dicing the optical device wafer, compared to the constituent material of the first electrode 107 and the second electrode 109.

Also, in the method for manufacturing the optical device chip 100 in accordance with the present embodiment, for example, the connecting sections 120, 121 and 128 can be formed with the same material as that of the first electrode 107 and the second electrode 109. By this, they can be formed by the same manufacturing process. In this case, the optical device chip 100 in accordance with the present embodiment can be formed, by merely changing mask patterns in the lithography step in the existing process for forming electrodes of optical device chips.

Embodiments of the invention are described above in detail. However, a person having an ordinary skill in the art should readily understand that many modifications can be made without departing in substance from the novel matter and effect of the invention. Accordingly, those modified examples are also deemed included in the scope of the invention.

For example, when an epitaxial lift-off (ELO) method is used, the substrate 101 can be separated from the optical device wafer 400 and the optical device chip 100. In other words, the optical device wafer 400 and the optical device chip 100 may be provided without the substrate 101.

What is claimed is:

1. A device wafer comprising:
   a chip region including a first semiconductor layer, a second semiconductor layer formed overlapping the first semiconductor layer, a first electrode electrically connected to the first semiconductor layer, and a second electrode electrically connected to the second semiconductor layer, and a contact layer formed between the second semiconductor and the second electrode; and
   a connecting section that electrically connects a first conductive section connected to the first electrode and a second conductive section connected to the second electrode, the connecting section including a first conductive portion and a second conductive portion, the second conductive portion including a pad section connected by the first conductive portion, a contact section in contact with a portion of the contact layer, and a lead-out section that connects the pad section to the contact section.

2. The device wafer according to claim 1, the first semiconductor layer and the second semiconductor layer having a different connectivity type.

3. The device wafer according to claim 1, the chip region further including
   an optical layer formed between the first semiconductor layer and the second semiconductor layer.

4. A device chip obtained after dicing a device wafer that includes a first semiconductor layer, a second semiconductor layer formed overlapping the first semiconductor layer, a first electrode electrically connected to the first semiconductor layer, a second electrode electrically connected to the second semiconductor layer, and a connecting section that electrically connects the first electrode and the second electrode, the device chip comprising:
   the first semiconductor layer;
   the second semiconductor layer formed overlapping the first semiconductor layer;
   the first electrode electrically connected to the first semiconductor layer;
   the second electrode electrically connected to the second semiconductor layer;
   a contact layer formed between the second semiconductor layer and the second electrode;
   a first conductive section connected to the first electrode; and
   a second conductive section connected to the second electrode, the second electrode including a pad section connected by the second conductive section, a contact section in contact with a portion of the contact layer, and a lead-out section that connects the pad section to the contact section.

5. The device chip according to claim 4, further including
   an optical layer being formed between the first semiconductor layer and the second semiconductor layer.

6. The device chip according to claim 4, the first semiconductor layer and the second semiconductor layer having a different conductivity type.

7. A device chip that is able to compose a portion of a device wafer that includes a first semiconductor layer, a second semiconductor layer formed overlapping the first semiconductor layer, a first electrode electrically connected to the first semiconductor, a second electrode electrically connected to the second semiconductor, and a connecting section that electrically connects the first electrode and the second electrode, the device chip comprising:
   the first semiconductor layer;
   the second semiconductor layer formed overlapping the first semiconductor layer,
   the first electrode electrically connected to the first semiconductor layer;
   the second electrode electrically connected to the second semiconductor layer;
   a first conductive section connected to the first electrode;
   a contact layer formed between the second semiconductor layer and the second electrode; and
   a second conductive section connected to the second electrode, the second electrode including a pad section connected by the second conductive section, a contact section in contact with a portion of the contact layer, and a lead-out section that connects the pad section to the contact section.

8. The device chip according to claim 7, the first semiconductor layer and the second conductor layer having a different conductivity type.

9. The device chip according to claim 7, further including an optical layer being formed between the first semiconductor layer and the second semiconductor layer.

* * * * *